US006708403B2

(12) United States Patent
Beaman et al.

(10) Patent No.: US 6,708,403 B2
(45) Date of Patent: Mar. 23, 2004

(54) ANGLED FLYING LEAD WIRE BONDING PROCESS

(75) Inventors: Brian Samuel Beaman, Apex, NC (US); Keith Edward Fogel, Mohegan Lake, NY (US); Paul Alfred Lauro, Nanuet, NY (US); Da-Yuan Shih, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/342,167

(22) Filed: Jan. 14, 2003

(65) Prior Publication Data

US 2003/0106213 A1 Jun. 12, 2003

Related U.S. Application Data

(63) Continuation of application No. 09/871,536, filed on May 31, 2001, now Pat. No. 6,526,655.

(51) Int. Cl.$^7$ ................................................. H01R 9/00
(52) U.S. Cl. ........................ 29/843; 29/840; 228/180.5; 228/199
(58) Field of Search ........................ 29/843, 840, 868, 29/860; 228/188, 189, 180.5, 199

(56) References Cited

U.S. PATENT DOCUMENTS

| 5,476,211 | A | * | 12/1995 | Khandros |
| 6,295,729 | B1 | * | 10/2001 | Beaman et al. |
| 6,526,655 | B2 | * | 3/2003 | Beaman et al. |

* cited by examiner

Primary Examiner—Carl J. Arbes
(74) Attorney, Agent, or Firm—Daniel P. Morris

(57) ABSTRACT

A method is described having the steps of providing a surface having a plurality of wire bondable locations; wire bonding a wire to each of the wire bondable locations using a wire capillary tool; controlling the position of the capillary tool with respect to the substrate; after forming a wire bond of the wire to the wire bondable location moving the capillary tool relative to the surface as the capillary tool is moved away from the surface to form a wire having a predetermined shape.

31 Claims, 15 Drawing Sheets

ANGLED FLYING LEAD WIRE BONDING PROCESS

This is a continuation of Ser. No. 09/871,536 filed May 31, 2001 now U.S. Pat. No. 6,526,655.

FIELD OF THE INVENTION

The present invention is directed to a process for bonding wires to surfaces, for example, to form electronic device probes, or to form electrical connections on electronic circuit devices and particularly to wires that are bonded at one end with the other end free.

BACKGROUND OF THE INVENTION

Wire bonding techniques were first developed back in the 1950's for connecting germanium transistors to other electronic devices. Wire bonding techniques continue to be used for the vast majority of integrated circuit device connections. Thermal energy, mechanical force and ultrasonic vibrations are used to bond the tiny wires to the device terminals.

The Angled Flying Lead (AFL) wire bonding process disclosed herein uses the same basic processes that are used for a standard thermosonic ball bonding operation and it was developed for fabricating a variety of area array and peripheral interconnections including high density land grid array connectors and high density IC probes.

In conventional wire bonding, schematically shown in FIG. 1, a free end of a wire is ball bonded to a contact pad on a surface. The wire is bent over and wedge bonded to another pad. The wire joining the two pads is curved. The shape of the curve is determined by the distance between the two pads which are joined. If the wire joining the two pads are severed, two wires having different shapes are formed. If it is desired that the wires bonded to the surface be used as an electronic device probe (as described herein) or to interconnect an array of contact pads on a first surface to another array of contact pads on a second surface which is facing the first surface, the conventional wire bonding process is not useful to fabricate such structures. To fabricate a probe for an electronic device using wires (probe wires) bonded to a surface, one end of the wire is bonded to contact pads on a support substrate for the probe wires. The other ends of the probe wires must be positioned so as to be able to contact the contact pads on device being tested. When an electronic device probe is moved into engagement with the contact pads of the device under test, the probe wires preferably flex so that the free end (probe tip) of the wires wipe across the surface of the contact pad being probed. The wiping action permits the probe tip to make good electrical contact to a contact pad. Since a probe is used many times, the probe tips of the probe wires make many thousands (preferably greater than 1000, more preferably greater than 10,000, most preferably greater than 100,000) engagements and disengagements with contact pads on devices under test resulting in many repeated bendings. The probe tip also must be flexible enough to achieve the desired degree of wiping, withstand many engagements without deforming and be sufficiently compressible to without deformation. Applicants invention provides a method and approach which can reliable form many probe wires to a desired predetermined shape to satisfy all these requirements.

There is a need for a technique to form wires bonded to surfaces where the wires can be formed to have any desired shape to provide certain desired properties. The wires can be bonded to electrical contact pads on a surface drawn away from the surface and cut to have a free end. The wires are bent so that the free ends are placed in a predetermined shape which provide advantageous properties, such as a desired flexibility.

SUMMARY OF THE INVENTION

It is the object of the present invention to provide a process for bonding wires to an electronic circuit device with one end of the wire attached to the surface of the device and the other end of the wire extending away from the surface of the device.

Another object of the present invention is to provide a process for bonding wires to an electronic circuit device with the wires formed at an angle to the surface of the device.

A further object of the present invention is to provide a process for bonding wires to an electronic circuit device with the wires having curved features.

BRIEF DESCRIPTION OF THE DRAWINGS

These and other objects, features, and advantages of the present invention will become apparent upon further consideration of the following detailed description of the invention when read in conjunction with the drawing figures, in which.

DETAILED DESCRIPTION OF THE INVENTION

Figure 1:
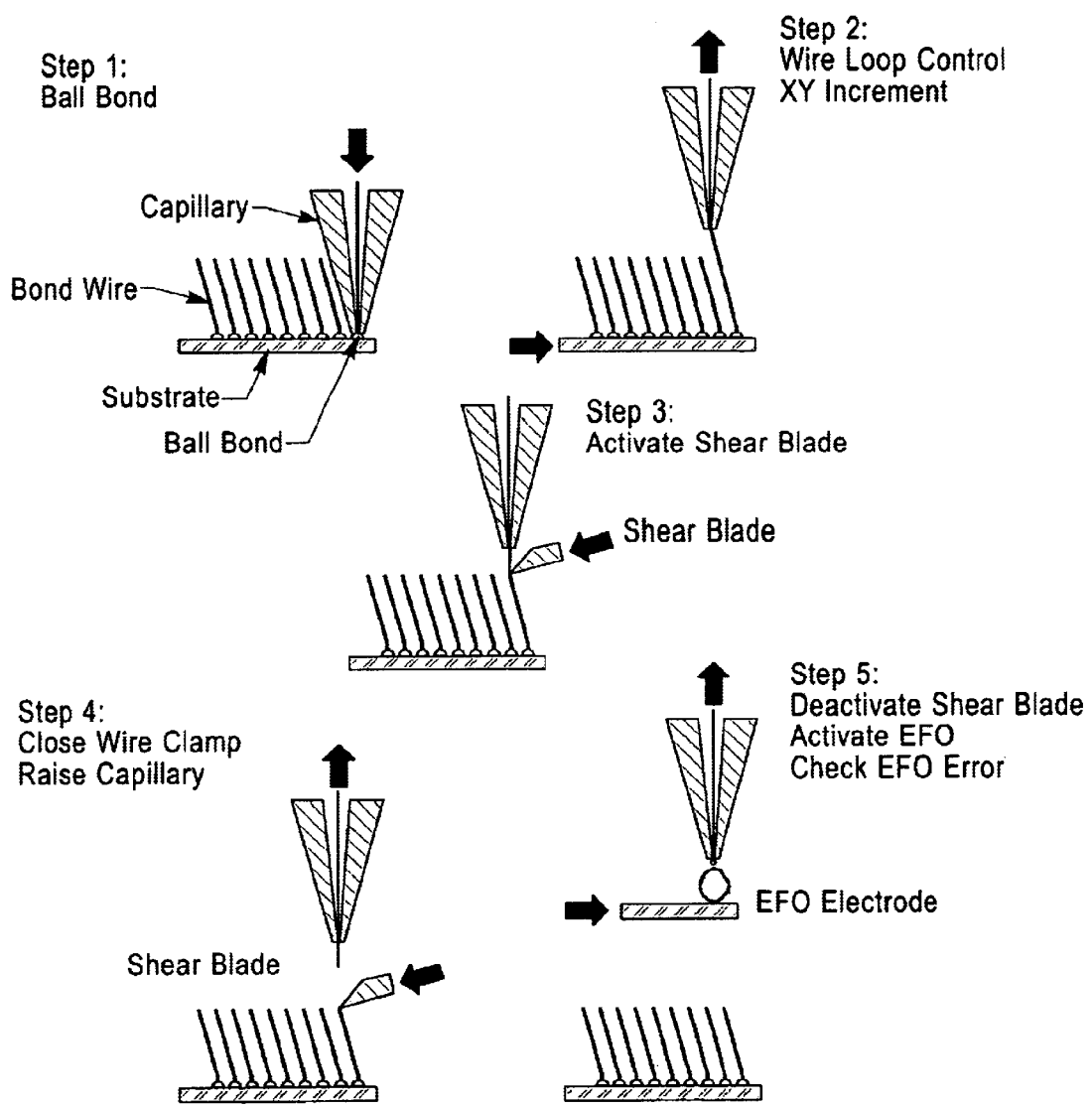
FIG. 1 shows the standard wire bonding process steps.

The standard wire bonding operation is shown in FIG. 1 and starts by forming a ball on the end of a (preferably) gold wire 110 that is threaded through a hollow pointed ceramic tool called a capillary 115. The ball 112 is pressed against the first bonding surface 116 of substrate 118 while the substrate 118 is heated from below and ultrasonic energy is applied through the capillary 115 as shown in step 1 of FIG. 1. The metallurgy on the surface of the substrate is critical to the wire bonding process. After ball bonding the wire to the first substrate surface 116, the capillary 115 is raised while the substrate is moved (shown by arrow 120) to create a loop shape in the wire (FIG. 1—step 2). The capillary 115 is then lowered to press the side 124 of the wire against the second substrate 126 surface 128 to form the second bond or wedge bond 130 (FIG. 1—step 3). The capillary is raised slightly indicated by arrow 132 and a mechanical clamp is actuated to hold the wire in place while the capillary is raised again to break the wire at the end of the wedge bond 134 (FIG. 1—step 4). The ball is formed on the end of the gold bond wire by placing an electrode below the tip 136 of the wire and using a high voltage electrical discharge to melt the end of the wire (FIG. 1—step 5).

Figure 2:
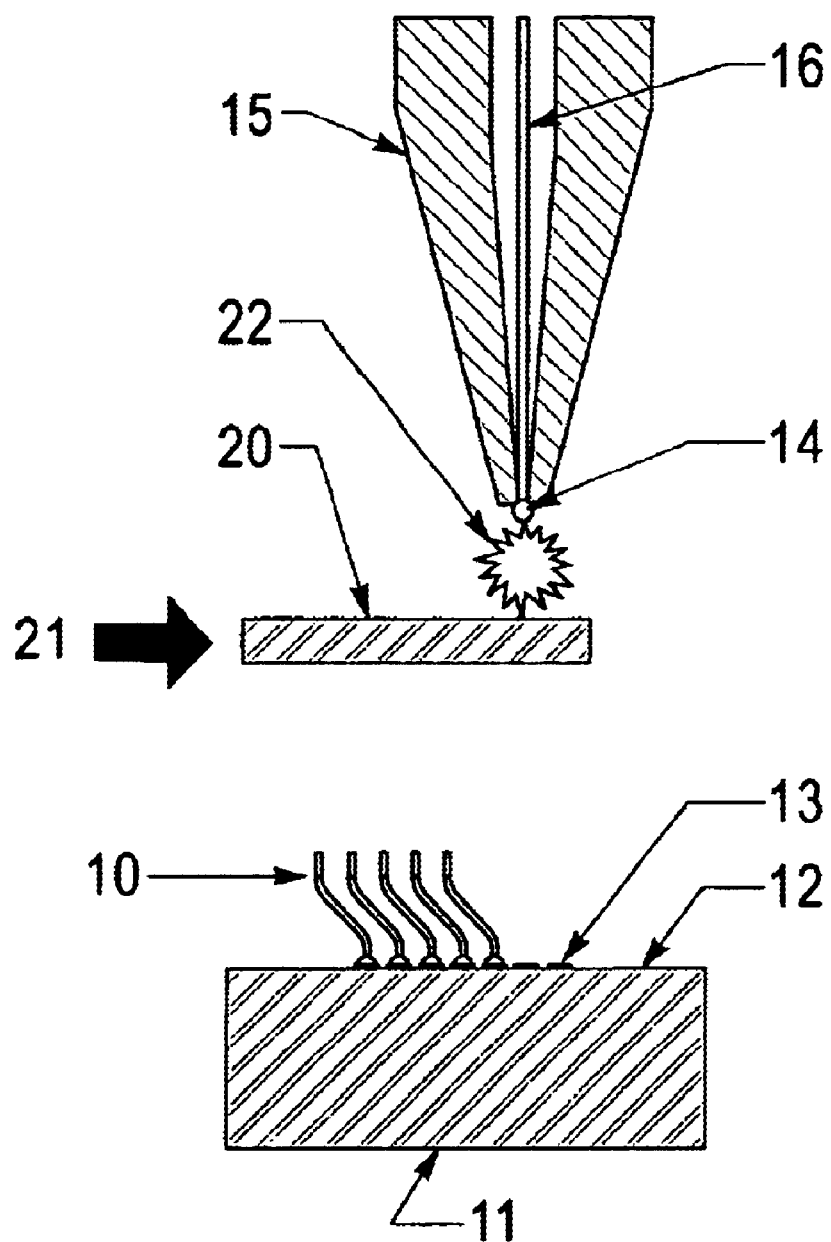
FIGS. 2–6 show the preferred embodiment of the angled flying lead wire bonding process.
Figure 3:
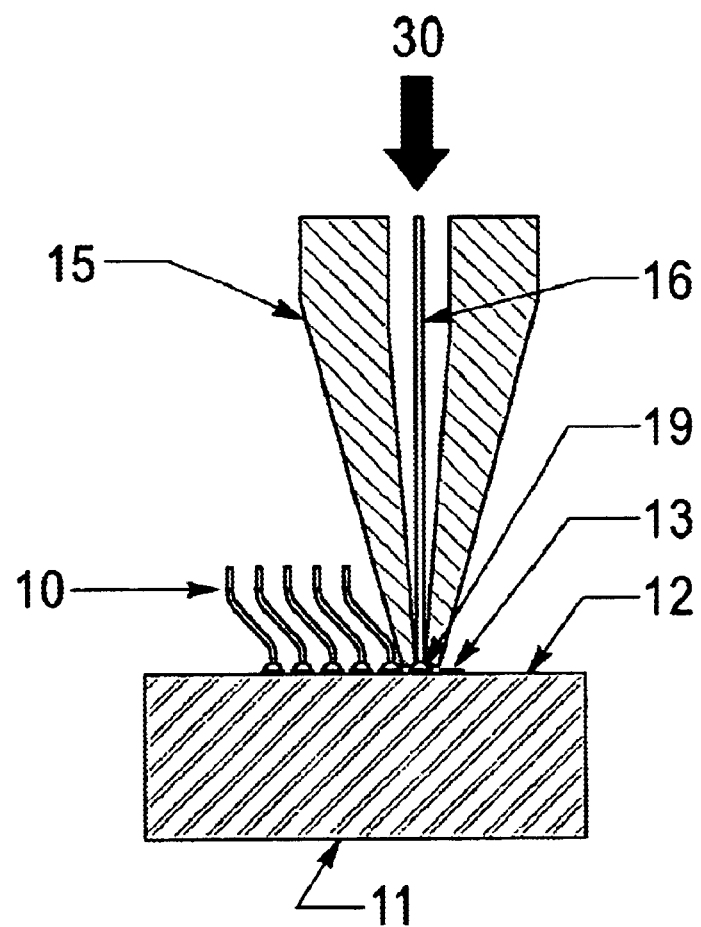

FIG. 2 shows a cross section of an electronic circuit component (11) and several angled flying leads (10) attached to the first surface (12) of the component (11) according to the present invention. The angled flying leads (10) can be attached to a variety of different electronic circuit components (11). The angled flying leads (10) are bonded to metallized circuit pads (13) on the first surface (12) of the electronic circuit component (11). The electronic circuit component (11) must provide a rigid base for the thermosonic wire bonding process to be successful. FIGS. 1, 2, and 3 of the angled flying lead wire bonding process are essentially the same as a standard thermosonic wire bonding process. An electrical discharge (22) from an electronic flame off (EFO) unit (21) is used to melt the end of the bond wire (16) extending through the tip of a ceramic capillary tool (15). The electrical discharge (22) is controlled to provide a consistent sized ball (14) on the end of the bond wire (16).

FIG. 3 shows the ceramic capillary tool (15) used to press the ball shaped end of the bond wire (16) against the metallized pad (13) on the surface of the electronic circuit component (11). Ultrasonic energy (30) applied through the ceramic capillary tool (15) and thermal energy applied through the base holding the electronic circuit component (11) in used to form a ball bond (19) between the bond wire (16) and the metallized pad (13) on the surface of the electronic circuit component (11).

Figure 4:
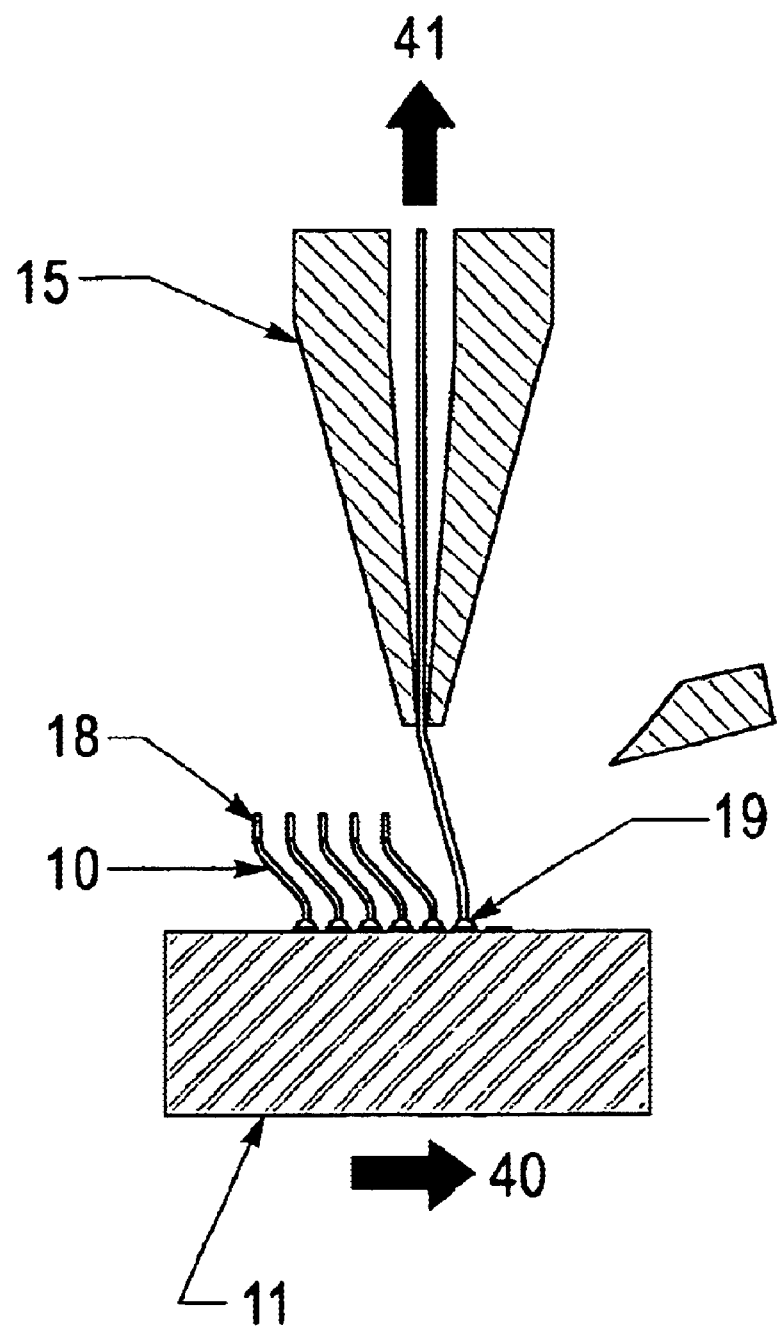

FIG. 4 shows the movement of the electronic circuit component (40) and the movement of the ceramic capillary tool (41). The movement of the electronic circuit component (40) is used to define the offset between the free end (18) of the angled flying lead (10) and the ball bond (19) attached to the electronic circuit component (11). The movement of the ceramic capillary tool (15) provides sufficient slack in the bond wire to minimize stress to the ball bond (19) during the subsequent operations.

Figure 5:
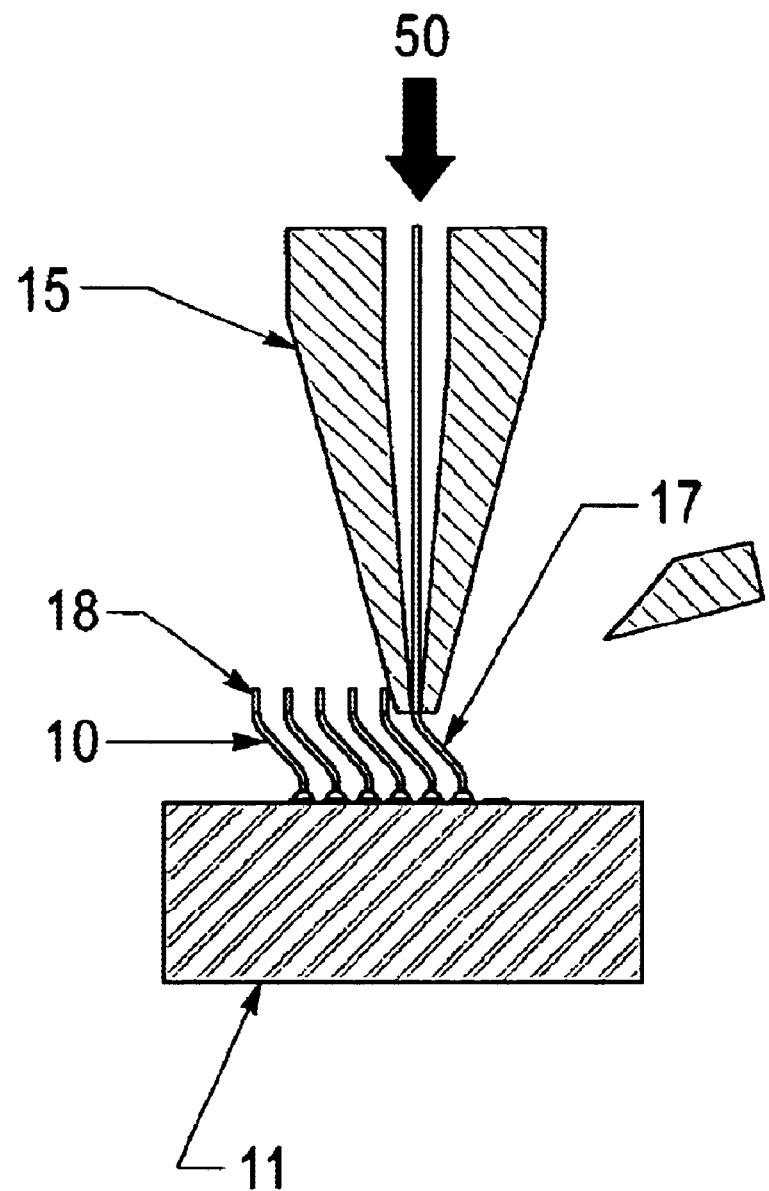

FIG. 5 shows additional movement of the ceramic capillary tool (50) that is used to form the angled and curved geometry (17) of the angled flying lead (10). The movement of the capillary tool (50) must be controlled to prevent deformation of the adjacent angled flying leads (10).

Figure 6:
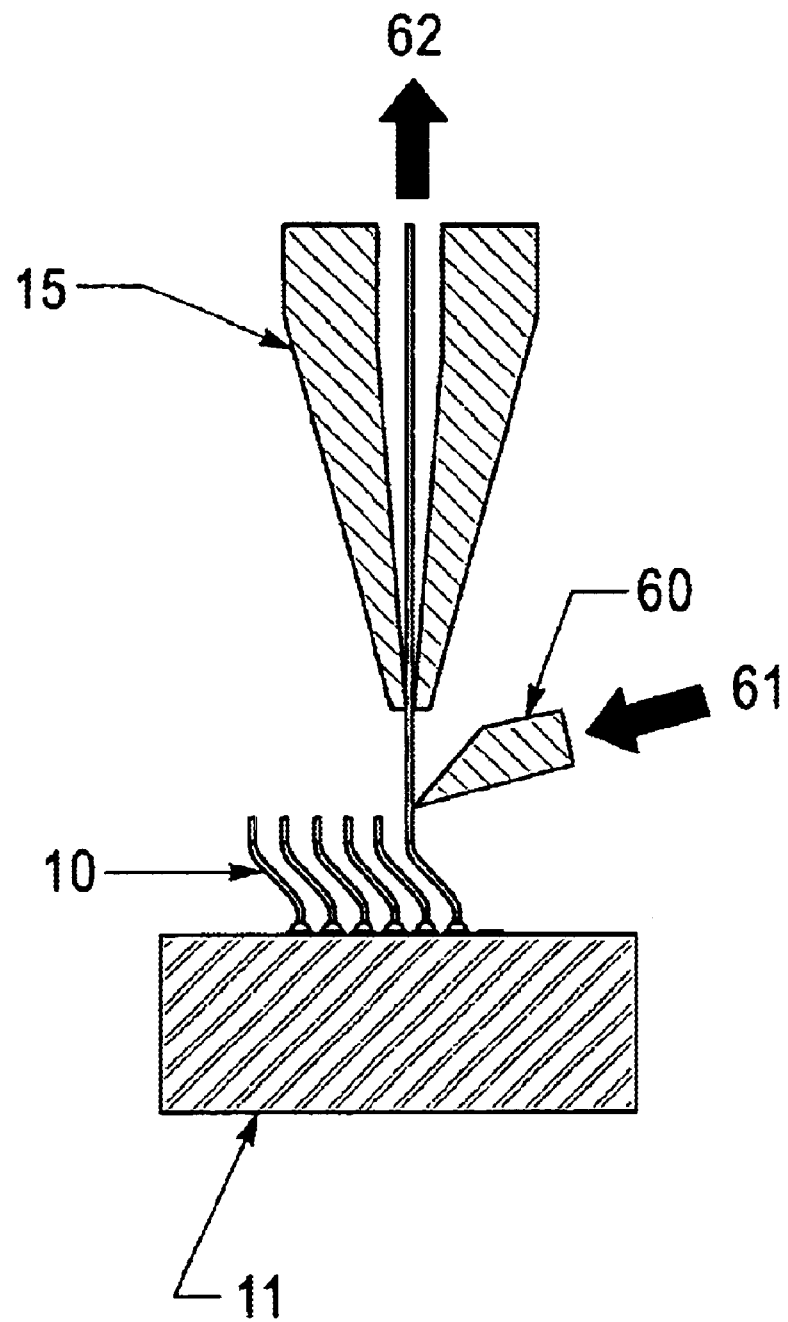

FIG. 6 shows the shear blade (60) that is used to sever the bond wire (62) to form the free end (18) of the angled flying lead (10). The shear blade (60) is precisely located (61) to ensure accurate positioning of the free end (18) of the angled flying lead (10). A clamp is used to hold the bond wire while the ceramic capillary tool (15) is raised (62) and the bond wire is severed at the tip of the shear blade (60).

Figure 7:
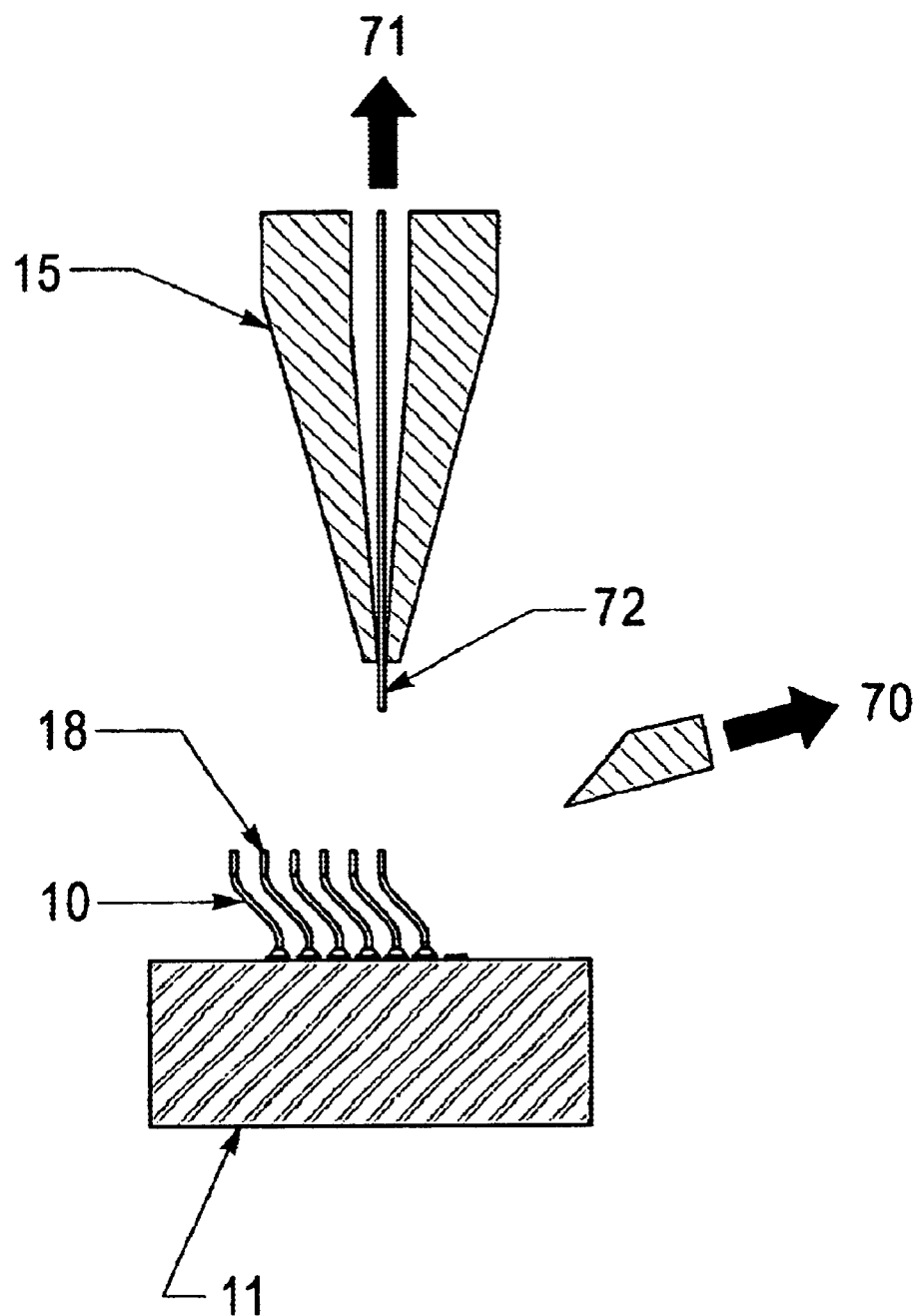
FIGS. 7–8 show the alternate embodiments of the angle flying lead wire bonding process.

FIG. 7 shows the retraction of the shear blade (70) and the upward movement of the ceramic capillary tool (71). The end of the bond wire (72) extending through the tip of the ceramic capillary tool is used for the next ball bond and the process is repeated to form the desired number of angled flying leads (10) on the electronic circuit component (11).

Figure 8:
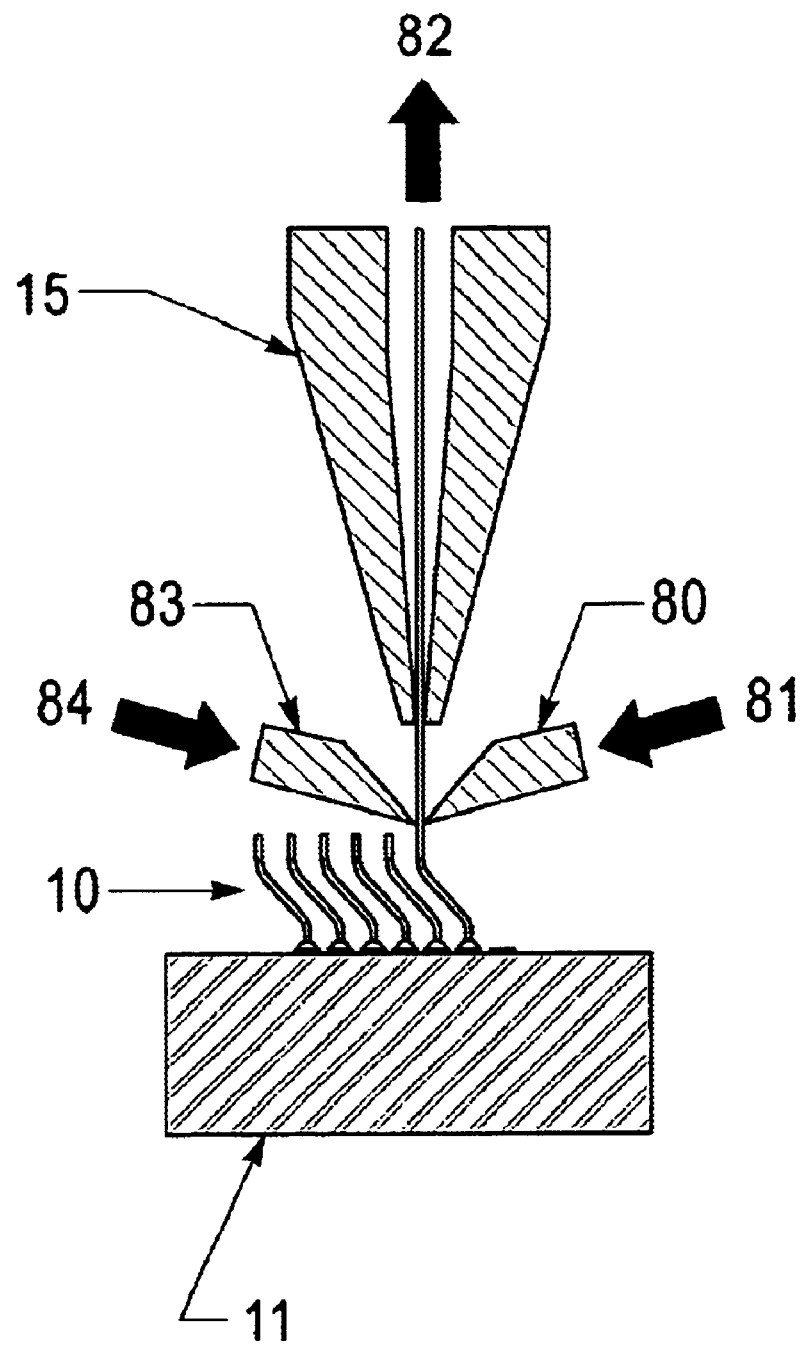

FIG. 8 shows an alternate embodiment of the wire cutting process shown in FIG. 5. The alternate wire cutting process shown in FIG. 7 uses two shear blades (80, 83) instead of a single blade. The movement and positioning (81, 84) of the two blades (80, 83) is synchronized to nick the wire on opposites sides and allow the wire to fracture at this point. The double-blade configuration can be used for cutting wires that have a high tensile strength. The two blade configuration also significantly improves wire positioning accuracy.

Figure 9:
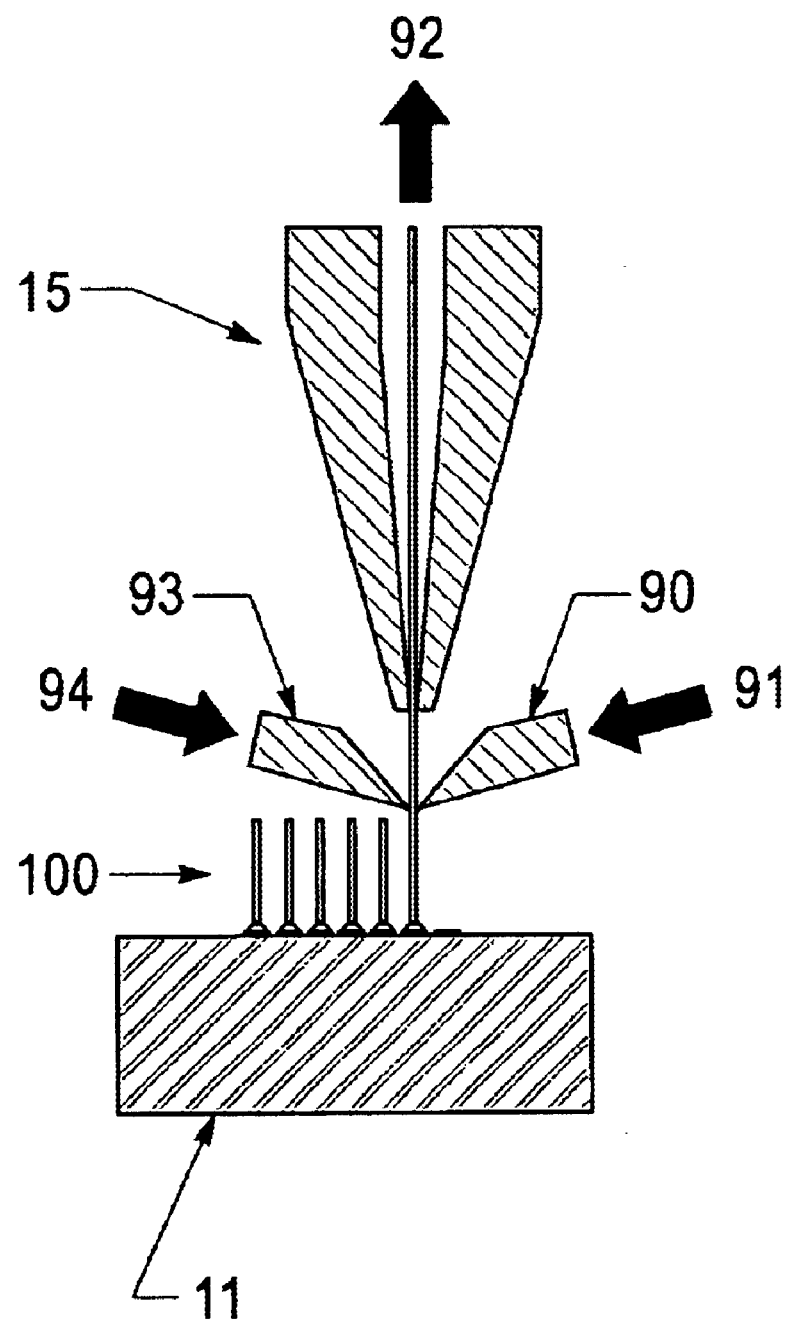
FIGS. 9–12 show various configurations of flying lead wire geometries.

FIG. 9 shows a second alternate embodiment of the wire cutting process similar to the two blade process shown in FIG. 8. The second alternate wire cutting process shown in FIG. 9 is used for creating straight wires (100) attached to an electronic circuit component (11). The movement and positioning (91, 94) of the two blades (90, 93) is controlled to nick the opposite sides of the wire and allow the wire to fracture at this point.

Figure 10:
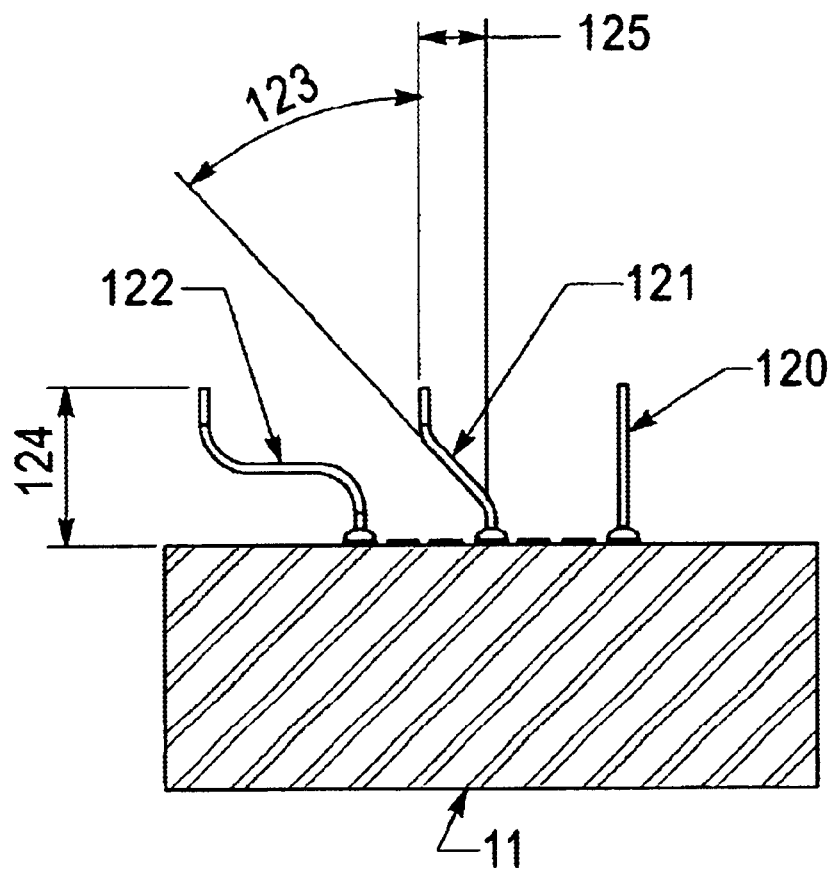

FIG. 10 shows three wire configurations (120, 121, 122) attached to an electronic circuit component (11) using the angled flying lead wire bonding process. All three of the wires (120, 121, 122) are created with the height (124) from the surface of the electronic circuit component (11). The three wire configurations include a straight wire (120), an angled wire (121), and a wire (122) with a section parallel to the surface of the electronic circuit component (11). Variations of these three wire configurations (120, 121, 122) can be created including wires with different angles (123) and different wire offset (125) dimensions as shown on the angled wire (121).

Figure 11:
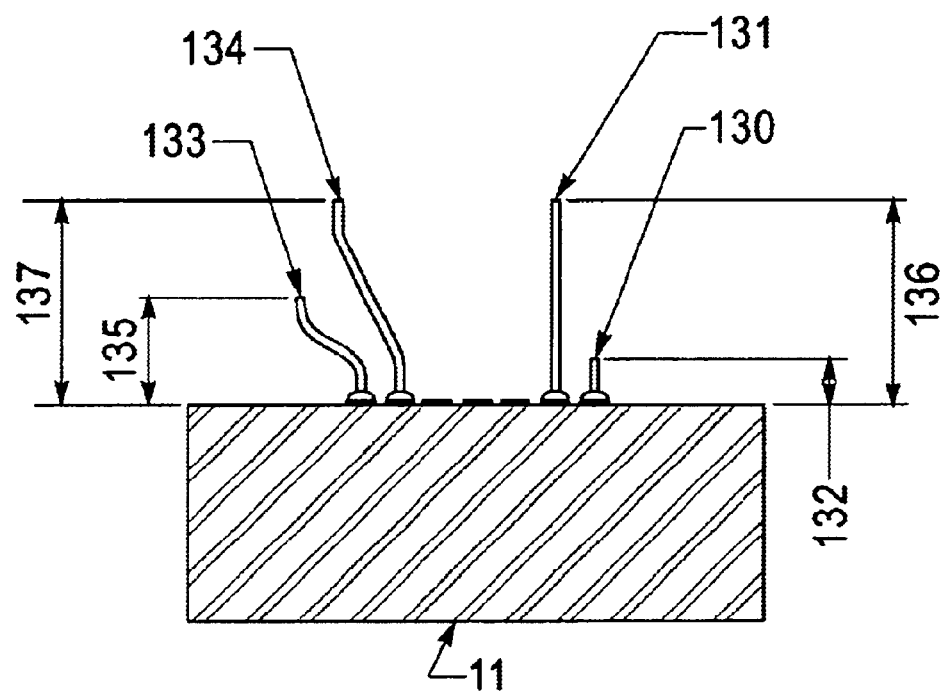

FIG. 11 shows four wire configurations (130, 131, 133, 134) attached to an electronic circuit component (11) using the angled flying lead wire bonding process. The four wire configurations include two straight wires (130, 131) with different wire heights (132, 136) and two angled wires (133, 134) with two different wire heights (135, 137).

Figure 12:
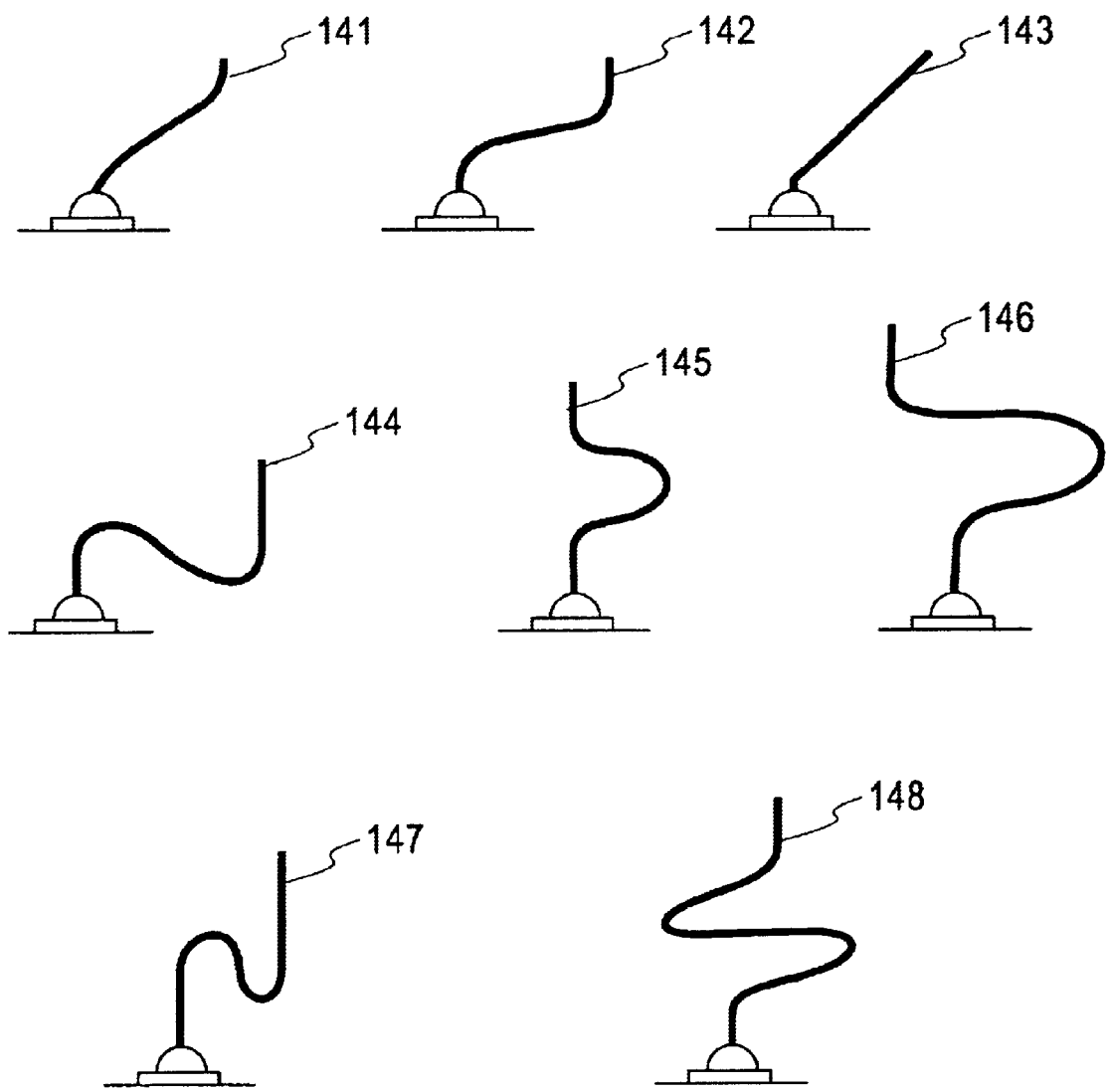
Figure 13:
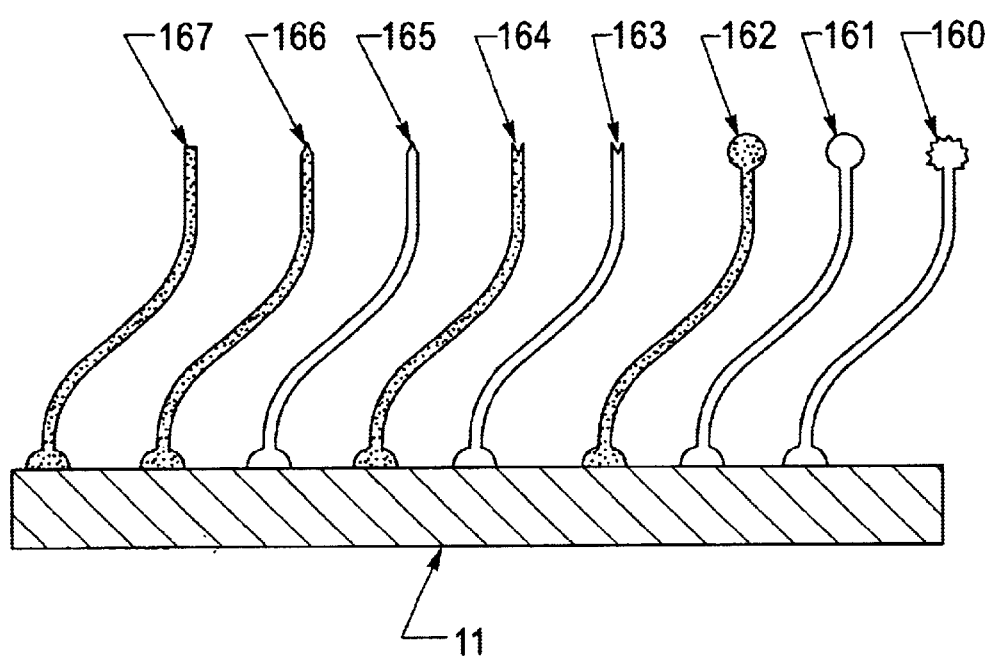
FIG. 13 shows a variety of shapes of the wire tip ends created to facilitate the engagement of wire tips with electronic device pads.

FIGS. 12 and 13 schematically show a variety of wire shapes (141, 142, 143, 144, 145, 146, 147, 148) practiced by the present invention. The different wire shapes are created by controlling both the down-movement of the capillary tip and the off-set move of the wire bonding stage. The shapes continuously curved, piece wire curved, piece wire linear and combinations thereof.

FIG. 13 schematically shows several shapes and geometries of the wire tip ends, such as straight (167), straight with pointed contact (166), straight with point contact deposited with a suitable contact metallurgy (165), straight end with sharp spikes (164) and deposited with a suitable contact metal (163), ball-shaped (162), ball-shaped deposited with a suitable contact metallurgy (161) and deposited with sharp spikes (160) at the contact ends.

Figure 14:
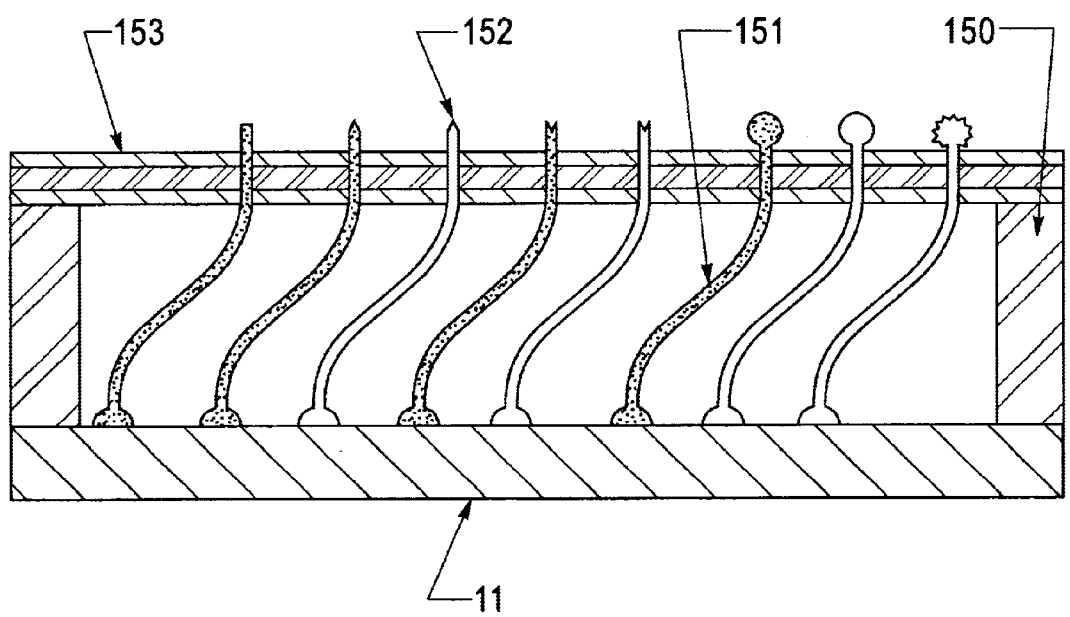
FIG. 14 schematically shows a frame structure to be used to control the wire position accuracy and, in the mean time, provide matched thermal coefficient to that of silicon at elevated wafer testing temperatures.

FIG. 14 schematically shows a frame structure (150, 153) which can be tailored to match the thermal expansion coefficient of silicon and other materials. The wire tip ends (152) need to be maintained in precise position before and after engagement with electronic device pads at up to 180° C. The various contact geometries as shown in the figure are fabricated at the end of wires to facilitate various contact and test applications.

Figure 15:
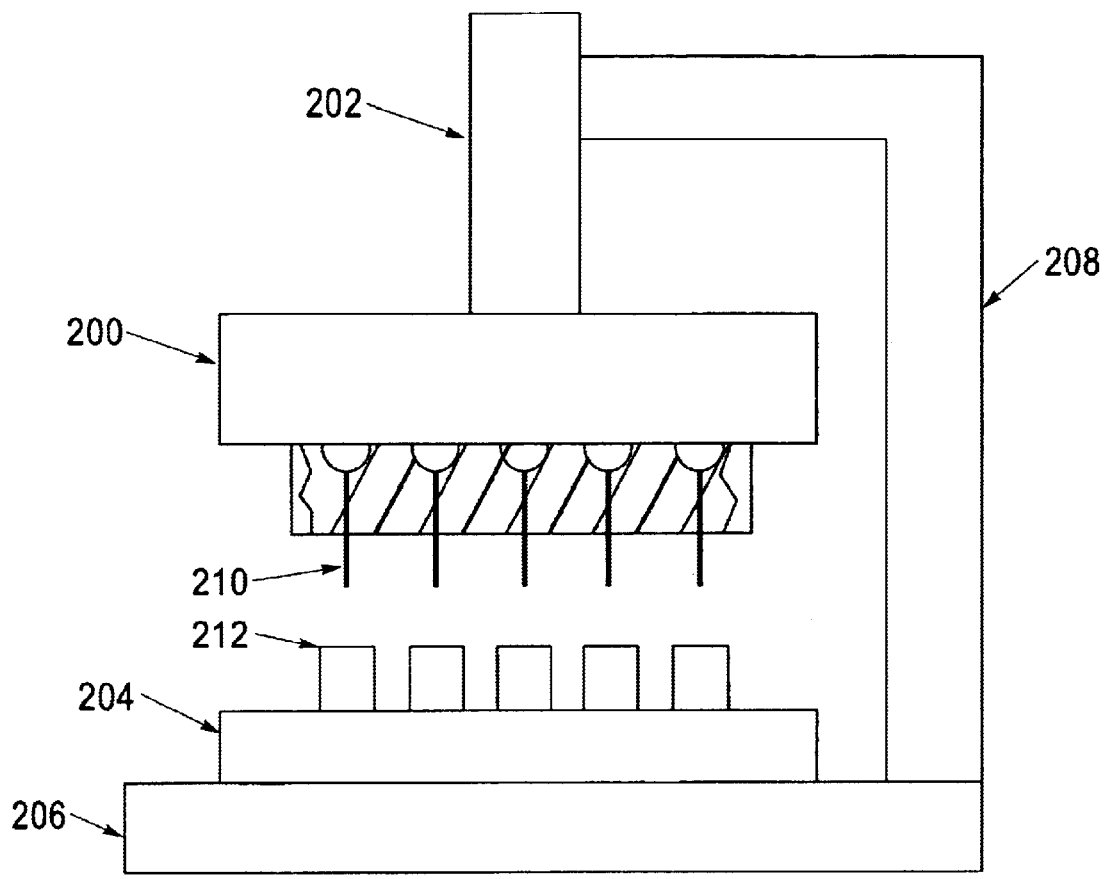
FIG. 15 is a schematic diagram showing the structures according to the present invention in testing apparatus.

FIG. 15 is a schematic diagram showing the structures according to the present invention in testing apparatus. The testing apparatus 208 has a measn 207 for disposing the probe tip ends 210 in contact with contact locations 212 on the device under test 204 which is disposed on support 206.

The minimum spacing between angled flying leads is dependent on the diameter of the bond wire that is used and the size and geometry of the capillary tip used for bonding the wires. Smaller diameter wires can be bonded closer together. The capillary tip geometry can be modified using a bottleneck configuration or a side relief to allow closer bonding of the flying leads. The maximum height for an angled flying lead is also determined by the diameter and material properties of the bond wire and the offset distance between the ball bond and the free end of the wire. Small diameter wires (0.001 to 0.002 inch) are better suited to shorter leads and larger diameter wires (0.002 to 0.003 inch) are better suited to longer leads. The key material properties of the wire include the stiffness and the tensile strength. The wire properties can be controlled by the alloys used in the wire material and the elongation factor used for forming the wire. The structures fabricated according to the methods of the present invention.

The teachings of copending U.S. application Ser. No. 09/088,394 filed Jun. 1, 1998 and U.S. Pat. No. 5,371,654 are incorporated herein by reference.

While we have described our preferred embodiments of our invention, it will be understood that those skilled in the art, both now and in the future, may make various improvements and enhancements which fall within the scope of the claims which follow. These claims should be construed to maintain the proper protection for the invention first disclosed.

What is claimed is:

1. A process for making angled flying lead wire structures attached to an electronic circuit component comprising:
    a first process step used to bond said flying lead wire to a first surface of said electronic circuit component;
    a second process step where the movement of the wire capillary tool and an XY stage are controlled to form a desired shape in said flying lead wire;
    a third process step where a single shear blade mechanism is positioned in contact with said flying lead wire;
    a forth process step where said capillary tool is raised to tension said wire against said shear blade and sever said wire;
    said flying lead wire is coated with a material.

2. A process according to claim 1, further including forming said flying lead wires with a plurality of angles relative to the surface of said electronic circuit component.

3. A process according to claim 2, further including forming said flying lead wires with a plurality of heights relative to the surface of said electronic circuit component.

4. A process according to claim 3, further including forming said flying lead wires to have a shape selected from the group consisting of linear, piece wise linear, continuously curved, and combinations thereof.

5. A process according to claim 1 wherein said electronic circuit component is a substrate having an electrical conductor pattern.

6. A process for making flying lead wire structures attached to an electronic circuit component comprising:
    bonding said flying lead wire to a first surface of said electronic circuit component;
    controlling the movement of the wire capillary tool and an XY stage to form a desired shape in said flying lead wire;
    shearing said flying lead wire with a double shear blade mechanism positioned on opposite sides of said flying lead wire and creating a small nick on opposite side of said wire;
    said capillary tool is raised to sever said wire at the point where said nicks were formed by said shear blades, said flying lead wires having wire tip end;
    said flying lead wire is coated with a material.

7. A process according to claim 6, further including forming said flying lead wires with a plurality of angles relative to the surface of said electronic circuit component.

8. A process according to claim 7, further including forming said flying lead wires with a plurality of heights relative to the surface of said electronic circuit component.

9. A method comprising:
    providing a substrate surface having a plurality of wire bondable locations; wire bonding a wire to each of said wire bondable locations using a wire capillary tool; controlling the position of said capillary tool with respect to said substrate; after forming a wire bond of said wire to said wire bondable location moving said capillary tool relative to said surface to form a wire having a predetermined shape, and severing said wire at a free end and said wire is coated with a material.

10. A process according to claims 1, 6 or 9, further including maintaining said flying lead wire in a predetermined position by disposing a sheet of material having a plurality of openings therein through which said flying lead wires project.

11. A process according to claim 10, wherein a compliant frame structure is used to support said sheet of material.

12. A process according to claim 10, wherein said sheet is spaced apart from said surface of said electronic component by a flexible support.

13. A process according to claim 12, wherein a space between said surface of the electronic component and said sheet is filled with a compliant medium.

14. A process according to claim 13, wherein said compliant medium is an elastomeric material.

15. A process according to claim 13, wherein said compliant medium is a formed polymer material.

16. A process according to claim 10, wherein said flexible support is selected from the group consisting of a spring and an elastomeric material.

17. A process according to claim 10, wherein said sheet is spaced apart from said surface of the electronic component by a rigid support, said rigid support serves as a stand-off, or hard stop, to limit the degree of movement of said wire tip end in a direction perpendicular to said surface.

18. A process according to claim 10, wherein said sheet is spaced apart from said surface of the electronic component by a support with the composite structure of both a rigid and a compliant layer.

19. A process according to claim 10, wherein said sheet comprises materials selected from the group consisting of Invar laminate, a Cu/Invar/Cu laminate and molybdenum laminate.

20. A process according to claim 19, wherein said the sheet is overcoated with a polymer layer.

21. A process according to claim 19, wherein the sheet is overcoated with an insulating layer.

22. A process according to claim 19, wherein the sheet is overcoated with a thin compliant polymer layer.

23. A process according to claim 19, wherein the sheet is laminated between two insulating layers.

24. A process according to claim 10, wherein said sheet comprises a material selected from the group consisting of a metal, a polymer, a semiconductor and dielectric.

25. A process for making angled flying lead wire structures attached to an electronic circuit component comprising:
    a first process step used to bond said flying lead wire to a first surface of said electronic circuit component;
    a second process step where the movement of the wire capillary tool and an XY stage are controlled to form a desired shape in said flying lead wire;
    a third process step where a single shear blade mechanism is positioned in contact with said flying lead wire;
    a forth process step where said capillary tool is raised to tension said wire against said shear blade and sever said wire;
    said flying lead wire tip end is coated with a material.

26. A process for making flying lead wire structures attached to an electronic circuit component comprising:

bonding said flying lead wire to a first surface of said electronic circuit component;

controlling the movement of the wire capillary tool and an XY stage to form a desired shape in said flying lead wire;

shearing said flying lead wire with a double shear blade mechanism positioned on opposite sides of said flying lead wire and creating a small nick on opposite side of said wire;

said capillary tool is raised to sever said wire at the point where said nicks were formed by said shear blades, said flying lead wires having wire tip end;

said flying lead wire tip end is coated with a material.

27. A method comprising:

providing a substrate surface having a plurality of wire bondable locations;

wire bonding a wire to each of said wire bondable locations using a wire capillary tool;

controlling the position of said capillary tool with respect to said substrate;

after forming a wire bond of said wire to said wire bondable location moving said capilary tool relative to said surface to form a wire having a predetermined shape, and severing said wire at a free end and said wire tip end is coated with a material.

28. A process according to anyone of claims 1, 6, 9, 25, 26, or 27, wherein said wire tip ends comprise a structure selected from the group consisting of a protuberance, a spherical contact geometry, a straight contact end, a sharp spike, multiple sharp spike, sharp modules and the combination of the above.

29. A process according to anyone of claims 1, 6, 9, 25, 26, or 27, wherein said wire end tips are coated with a material selected from the group consisting of Ir, Pd, Pt, Ni, Au, Rh, Ru, Re, Co, Cu, and their alloys.

30. A process according to anyone of claims 1, 6, 9, 25, 26, or 27, wherein said angle flying lead wire is coated with a material selected from the group consisting of Ir, Pd, Pt, Ni, Au, Rh, Ru, Re, Co, Cu, and their alloys.

31. A process according to anyone of claims 1, 6, 9, 25, 26, or 27, to test an electronic device further comprising:

retractably moving said angled flying lead wire structure towards and away from said electronic device so that said wire tip ends contact electrical contact locations on said electronic device, and applying electrical signals to said elongated electrical conductors.

* * * * *

UNITED STATES PATENT AND TRADEMARK OFFICE
CERTIFICATE OF CORRECTION

PATENT NO. : 6,708,403 B2
APPLICATION NO. : 10/342167
DATED : March 23, 2004
INVENTOR(S) : Brian Samuel Beaman et al.

It is certified that error appears in the above-identified patent and that said Letters Patent is hereby corrected as shown below:

On page 1 in the field "Related U.S. Application Data" in field (63), add before the period:

--which is a division of Application No. 09/164,470 filed on October 1, 1998, now Patent No. 6,295,729 is a continuation-in-part of Application No. 09/088,394, filed June 1, 1998, now Patent 6,300,780, which is a division of Application No. 08/754,869, filed on November 22, 1996, now Patent 5,821,763, which is a continuation of Application No. 08/055,485, filed on April 30, 1993, now issued as Patent 5,635,846, which is a continuation-in-part of Applicaton No. 07/963,346, filed on October 19, 1992, now Patent No. 5,371,654 and claims priority to provisional Application No. 60/060,877, filed October 2, 1997.--

In Column 1, line 6, add before the period:

--which is a division of Application No. 09/164,470 filed on October 1, 1998, now Patent No. 6,295,729 is a continuation-in-part of Application No. 09/088,394, filed June 1, 1998, now Patent 6,300,780, which is a division of Application No. 08/754,869, filed on November 22, 1996, now Patent 5,821,763, which is a continuation of Application No. 08/055,485, filed on April 30, 1993, now issued as Patent 5,635,846, which is a continuation-in-part of Applicaton No. 07/963,346, filed on October 19, 1992, now Patent No. 5,371,654 and claims priority to provisional Application No. 60/060,877, filed October 2, 1997.--

Signed and Sealed this

Twentieth Day of February, 2007

JON W. DUDAS
*Director of the United States Patent and Trademark Office*